(12) United States Patent
Chen et al.

(10) Patent No.: US 8,569,080 B2
(45) Date of Patent: Oct. 29, 2013

(54) METHOD FOR PACKAGING LIGHT EMITTING DIODE

(75) Inventors: Li-Hsiang Chen, Hsinchu (TW); Hsin-Chiang Lin, Hsinchu (TW); Pin-Chuan Chen, Hsinchu (TW)

(73) Assignee: Advanced Optoelectronic Technology, Inc., Hsinchu Hsien (TW)

( * ) Notice: Subject to any disclaimer, the term of this patent is extended or adjusted under 35 U.S.C. 154(b) by 0 days.

(21) Appl. No.: 13/523,878

(22) Filed: Jun. 14, 2012

(65) Prior Publication Data

US 2013/0052764 A1 Feb. 28, 2013

(30) Foreign Application Priority Data

Aug. 25, 2011 (CN) .......................... 2011 1 0245721

(51) Int. Cl.
*H01L 21/00* (2006.01)

(52) U.S. Cl.
USPC .................... 438/22; 438/25; 438/26; 438/42; 438/106; 438/112; 257/E21.021; 257/E21.044; 257/E21.25; 257/E21.305; 257/E21.499

(58) Field of Classification Search
USPC ........... 438/22–28, 42–44, 65, 117, 106–112, 438/124–127, 550; 257/E33.056, E21.044, 257/E21.499, E21.021, E21.25, E21.305, 257/81.88, 89, 98–103; 216/52, 39; 264/293, 319; 428/56, 112, 156, 298.1, 428/344, 457, 458, 688, 901; 156/60, 93, 156/219, 581, 222, 277, 301; 525/403; 313/503; 427/99.4

See application file for complete search history.

(56) References Cited

U.S. PATENT DOCUMENTS

| 7,199,400 | B2* | 4/2007 | Sasuga | 257/98 |
|---|---|---|---|---|
| 2009/0095974 | A1* | 4/2009 | Taguchi et al. | 257/99 |
| 2010/0213490 | A1* | 8/2010 | Park et al. | 257/98 |
| 2010/0215887 | A1* | 8/2010 | Kawabe | 428/56 |
| 2012/0112236 | A1* | 5/2012 | Higuma et al. | 257/98 |
| 2013/0001613 | A1* | 1/2013 | Hong et al. | 257/98 |

* cited by examiner

*Primary Examiner* — Mohsen Ahmadi
(74) *Attorney, Agent, or Firm* — Altis & Wispro Law Group, Inc.

(57) ABSTRACT

A method of packaging a light emitting diode comprising: providing a flexible substrate with a heat-conducting layer, an insulating layer covering on a surface of the heat-conducting layer and an electrically conductive layer positioned on the insulating layer; etching the conductive layer to form a gap in the conductive layer and expose a part of the insulating layer, the conductive layer being separated by the gap into a first electrode and a second electrode isolated from each other; stamping the flexible substrate with a mold at the position of the gap to form a recess in the flexible substrate; positioning a light emitting element on the conductive layer and electrically connecting the light emitting element to the conductive layer; and forming an encapsulation to cover the light emitting element.

12 Claims, 7 Drawing Sheets

METHOD FOR PACKAGING LIGHT EMITTING DIODE

BACKGROUND

1. Technical Field

The present disclosure generally relates to a method for packaging a semiconductor structure, and particularly to a method for packaging a lighting emitting diode (LED).

2. Description of Related Art

LEDs are solid state light emitting devices, which are more stable and reliable than other conventional light sources such as incandescent bulbs. Thus, LEDs are being widely used in various fields such as numeral/character displaying elements, signal lights, light sources for lighting and display devices. Generally, LEDs are packaged to provide protection, color selection, focusing and the like for light emitted by the LEDs.

A typical method for packaging an LED includes: providing a substrate firstly; forming a recess on the substrate by etching; setting a metal layer and an insulating layer in the recess, wherein the shapes of the metal layer and the insulating layer match with the size of the recess; and disposing an LED in the recess.

However, both the shape and the smoothness of the recess by the conventional etching method is difficult to control, which unfavorably affects the stability and the luminous quality of the lighting emitting diode structure. In addition, it's difficult to position accurately corresponding packaging layers to match the recess. Furthermore, the conventional packaging method is complex, and hardly satisfies mass production requirement.

What is needed therefore is a method for packaging a light emitting diode which can overcome the above mentioned limitations.

BRIEF DESCRIPTION OF THE DRAWINGS

Many aspects of the disclosure can be better understood with reference to the following drawings. The components in the drawings are not necessarily drawn to scale, the emphasis instead being placed upon clearly illustrating the principles of the disclosure.

DETAILED DESCRIPTION

Reference will now be made to the drawings to describe the present method for packaging the LED, in detail.

Figure 1:
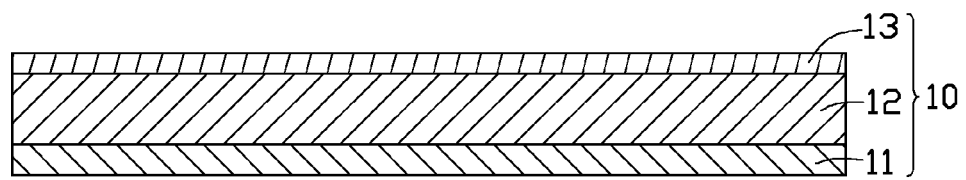
FIGS. 1 to 7 are cross-sectional views showing different steps of a method for packaging an LED in accordance with one embodiment of the present disclosure.

Referring to FIG. 1, a flexible substrate 10 is provided. In this embodiment, the flexible substrate 10 has a thickness in a range from 50 to 150 microns; therefore, it can be deformed partly under an external force without being broken. The flexible substrate 10 includes a heat conducting layer 11, an insulating layer 12 located on the heat-conducting layer 11 and a conductive layer 13 positioned on the insulating layer 12.

In this embodiment, the heat conducting layer 11 is an aluminum layer, contacting a bottom surface of the insulating layer 12. The heat-conducting layer 11 is capable of absorbing heat from the conductive layer 13 and dissipating the heat in time. Alternatively, the heat-conducting layer 11 can also be made other heat-conducting materials with high formability.

The insulating layer 12 is flat, and sandwiched between a top surface of the heat-conducting layer 11 and a bottom surface of the conductive layer 13. The material of the insulating layer 12 can be made of polymer, plastic or other electrically insulating materials such as silica oxide or silicon nitride.

The conductive layer 13 is attached to a top surface of the insulating layer 12. The conductive layer 13 can be secured on the insulating layer 12 by solder or hot-melt adhesive. Since both of the conductive layer 13 and the insulating layer 12 have smooth surfaces, they can be connected together intimately. The conductive layer 13 can be made of electrically conductive materials with high formability. In this embodiment, the conductive layer 13 is a copper foil. Alternatively, the conductive layer 13 can be formed by epitaxial doping, diffusion doping or ion implantation and so on.

Figure 2:
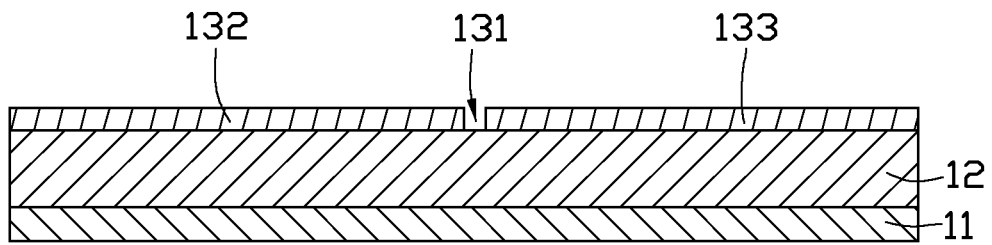

Referring to FIG. 2, the conductive layer 13 is etched to form a gap 131 and expose a part of the insulating layer 12. The conductive layer 13 is divided by the gap 131 into two apart electrodes, i.e., a first electrode 132 and a second electrode 133 isolated from each other.

Figure 3:
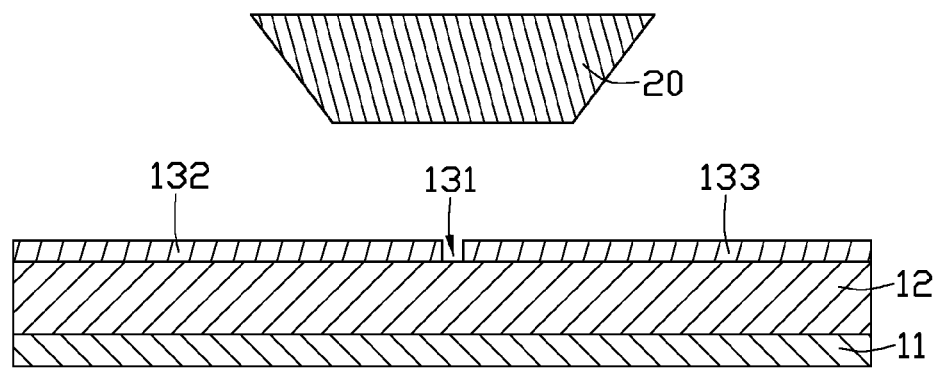

Referring to FIG. 3, a mold 20 is provided. The shape of the mold 20 can be designed according to actual requirement. In this embodiment, the mold 20 is shaped to have a shape of an inverted isosceles trapezoid, with a top side thereof longer than a bottom side thereof.

Figure 4:
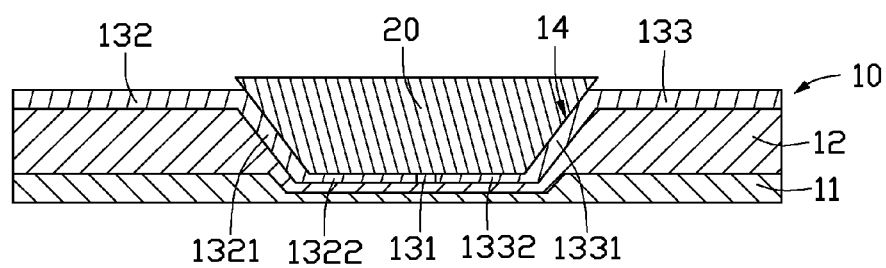
Figure 5:
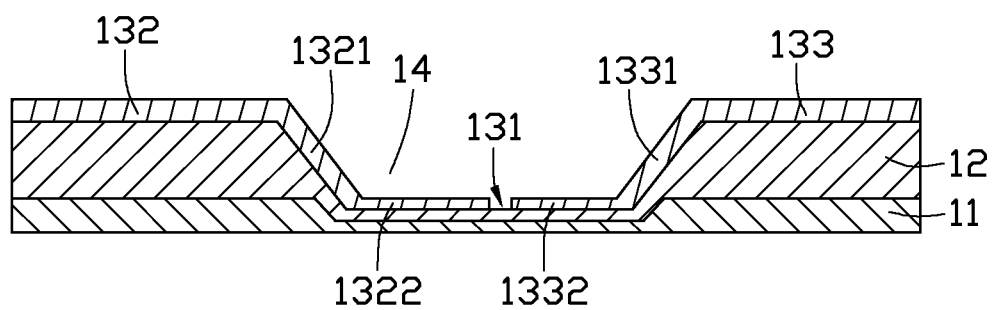

Referring to FIG. 4, the flexible substrate 10 is hot pressed downwardly by the mold 20 under 100 to 150 degrees centigrade thereby to define a recess 14 therein. During the pressing process, the bottom side of the mold 20 faces the flexible substrate 10, and a central axis of the mold 20 aligns with a center of the gap 131. The recess 14 is axisymmetrical relative to the center of the gap 131.

Then, the mold 20 is removed. Neighboring parts of the first electrode 132 and the second electrode 133 are pressed to be thinner and longer, thereby forming a first sidewall 1321 and a second sidewall 1331 symmetrical to each other, and a first bottom wall 1322 and a second bottom wall 1332 symmetrical to each other. The first sidewall 1321 and the second sidewall 1331 are declined. The first bottom wall 1322 and the second bottom wall 1332 are horizontal and isolated from each other. A middle portion of each of the insulating layer 12 and the heat-conducting layer 11 is pressed by the mold 20 into a depressed shape, following the formation of the recess 14.

Figure 6:
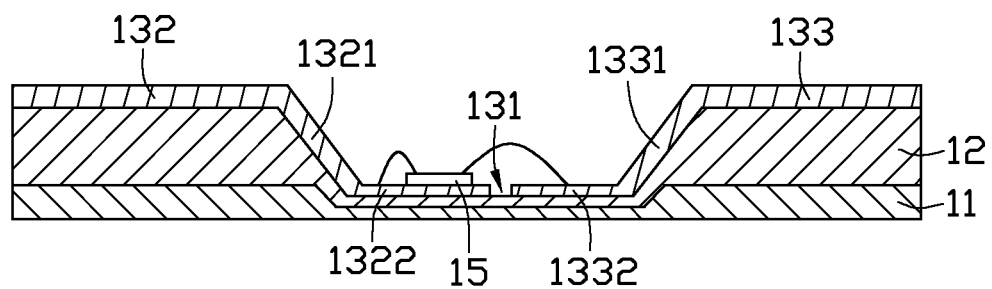

Referring to FIG. 6, a light emitting element 15 is positioned in the recess 14 and on the conductive layer 13. In this embodiment, the light emitting element 15 is located on the first bottom wall 1322 of the first electrode 132. The light emitting element 15 is an LED chip and electrically connected to the first electrode 132 and the second electrode 133 via two wires (not labeled) respectively.

Figure 7:
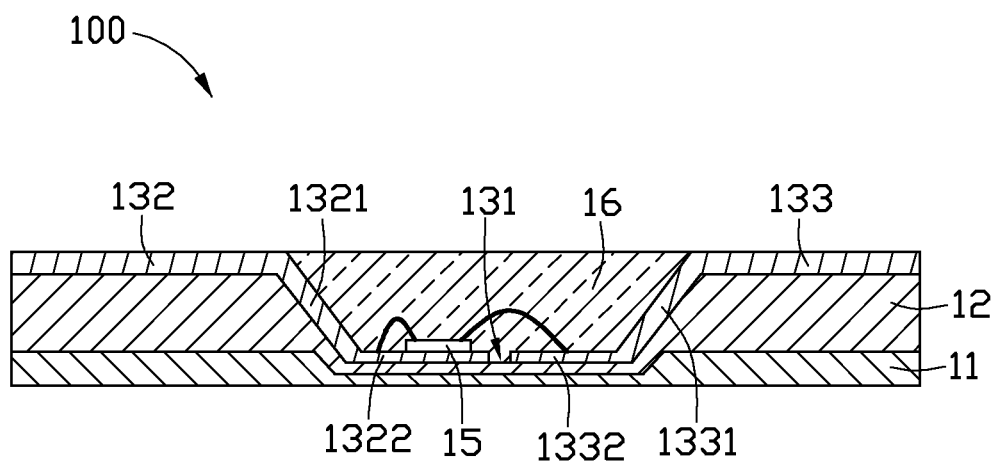

Referring to FIG. 7, an encapsulation 16 is filled in the recess 14. The encapsulation 16 covers the light emitting element 15 and the wires, and has a top surface coplanar with the top surfaces of the first electrode 132 and the second electrode 133. The encapsulation 16 is made of silicone or epoxy resin. The encapsulation 16 can also include fluorescent materials distributed therein. The encapsulation 16 protects the light emitting element 15 from moisture and dust. Thus, an LED package structure 100 is formed. The encapsulation 16 also fills in the gap 131. The fluorescent materials can change the color of light from the light emitting element 15 to a desired color.

In the present LED packaging method, the heat-conducting layer 11, the insulating layer 12 and the conductive layer 13 are firstly attached together, and secondly pressed to form the recess 14, and then the light emitting element 15 is positioned in the recess 14, finally the encapsulation 16 is filled into the recess 14 to cover the light emitting element 15. Related elements in the LED package structure 100 can be positioned and attached to each other more accurately. In addition, the packaging method is simple and time saving for mass production.

It is to be understood that the above-described embodiments are intended to illustrate rather than limit the disclosure. Variations may be made to the embodiments without departing from the spirit of the disclosure as claimed. The above-described embodiments illustrate the scope of the disclosure but do not restrict the scope of the disclosure.

What is claimed is:

1. A method for packaging a light emitting diode comprising:
   providing a flexible substrate having a thickness in a range from 50 to 150 microns whereby the substrate is flexible, the flexible substrate comprising a heat-conducting layer, an insulating layer located on the heat-conducting layer and an electrically conductive layer positioned on the insulating layer;
   etching the conductive layer to form a gap and expose a part of the insulating layer, the conductive layer being divided by the gap into a first electrode and a second electrode isolated from each other;
   pressing the flexible substrate with a mold to form a recess in the substrate, wherein neighboring parts of the first electrode and the second electrode are pressed to be thinner and longer, and the gap is located below the recess;
   positioning a light emitting element in the recess, the light emitting element being located on the conductive layer and electrically connected to the first and second electrodes of the conductive layer; and
   forming an encapsulation in the recess to cover the light emitting element.

2. The method for packaging a light emitting diode according to claim 1, wherein the mold is shaped to have a shape of an inverted isosceles trapezoid with a top side thereof longer than a bottom side thereof.

3. The method for packaging a light emitting diode according to claim 2, wherein during the pressing process, a center of the mold is aligned with a center of the gap and the bottom side of the mold engages with the conductive layer.

4. The method for packaging a light emitting diode according to claim 3, wherein the pressing process is a hot pressing.

5. The method for packaging a light emitting diode according to claim 4, wherein the hot pressing is performed under 50 to 150 degrees centigrade.

6. The method for packaging a light emitting diode according to claim 3, wherein after the pressing process of the flexible substrate, the conductive layer, the insulating layer and the heat-conducting layer are partly deformed downwardly to form the recess.

7. The method for packaging a light emitting diode according to claim 3, wherein after the pressing process of the flexible substrate, the flexible substrate is symmetrical to the center of the gap.

8. The method for packaging a light emitting diode according to claim 3, wherein after the pressing process of the flexible substrate, each of the first and second electrodes is deformed to include a sidewall and a bottom wall, and the sidewall and the bottom wall are received in the recess.

9. The method for packaging a light emitting diode according to claim 8, wherein the sidewalls of the two electrodes are declined, and the bottom walls of the two electrodes are horizontal.

10. The method for packaging a light emitting diode according to claim 8, wherein the light emitting element is received in the recess and located at a bottom wall of one of the electrodes.

11. The method for packaging a light emitting diode according to claim 3, wherein after the pressing process of the flexible substrate, a middle portion of each of the insulating layer and the heat-conducting layer is pressed into a depressed shape.

12. The method for packaging a light emitting diode according to claim 1, wherein the encapsulation is formed by filling the encapsulation in the recess with a top surface of the encapsulation coplanar with top surfaces of the first electrode and the second electrode.

* * * * *